(12) United States Patent
Chun et al.

(10) Patent No.: US 10,586,877 B2
(45) Date of Patent: Mar. 10, 2020

(54) SEMICONDUCTOR DEVICE AND METHOD OF MANUFACTURING THE SAME

(71) Applicants: Hyundai Motor Company, Seoul (KR); Kia Motors Corporation, Seoul (KR)

(72) Inventors: Dae Hwan Chun, Gwangmyeong-si (KR); NackYong Joo, Hanam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/165,414

(22) Filed: Oct. 19, 2018

(65) Prior Publication Data

US 2019/0341503 A1    Nov. 7, 2019

(30) Foreign Application Priority Data

May 4, 2018    (KR) ......................... 10-2018-0051816

(51) Int. Cl.
*H01L 29/872*    (2006.01)
*H01L 29/06*    (2006.01)
(Continued)

(52) U.S. Cl.
CPC ...... *H01L 29/872* (2013.01); *H01L 21/02378* (2013.01); *H01L 21/02529* (2013.01); *H01L 21/02634* (2013.01); *H01L 21/046* (2013.01); *H01L 21/0475* (2013.01); *H01L 21/0485* (2013.01); *H01L 21/0495* (2013.01); *H01L 29/0684* (2013.01); *H01L 29/1608* (2013.01); *H01L 29/36* (2013.01); *H01L 29/417* (2013.01);
(Continued)

(58) Field of Classification Search
CPC ............... H01L 29/872; H01L 29/1608; H01L 29/0684; H01L 29/66143; H01L 29/36; H01L 29/417; H01L 29/6606; H01L 21/0485; H01L 21/0495; H01L 21/02378; H01L 21/0475; H01L 21/046; H01L 21/02529; H01L 21/02634
See application file for complete search history.

(56) References Cited

U.S. PATENT DOCUMENTS

| | | | |
|---|---|---|---|
| 8,772,112 B1 | 7/2014 | Chun et al. | |
| 2004/0238882 A1* | 12/2004 | Suzuki | H01L 21/78 257/330 |

(Continued)

FOREIGN PATENT DOCUMENTS

| | | | |
|---|---|---|---|
| JP | 5777487 B2 | 9/2015 | |
| JP | 5981859 B2 | 8/2016 | |

*Primary Examiner* — Sitaramarao S Yechuri
(74) *Attorney, Agent, or Firm* — Morgan, Lewis & Bockius LLP

(57) ABSTRACT

A semiconductor device may include: an n type of layer disposed on a first surface of a substrate; a p+ type of region disposed on the first surface of the substrate; a p− type of region disposed at a top portion of the n type of layer; a first electrode disposed on the p+ type of region and the p− type of region; and a second electrode disposed on a second surface of the substrate, wherein the side surface of the p+ type of region and the side surface of the n type of layer are in contact, and the thickness of the p+ type of region is the same as the thickness of the n type of layer and the thickness of the p− type of region.

11 Claims, 11 Drawing Sheets

(51) Int. Cl.
   *H01L 29/417*   (2006.01)
   *H01L 29/16*    (2006.01)
   *H01L 21/02*    (2006.01)
   *H01L 21/04*    (2006.01)
   *H01L 29/66*    (2006.01)
   *H01L 29/36*    (2006.01)

(52) U.S. Cl.
   CPC .... *H01L 29/6606* (2013.01); *H01L 29/66143* (2013.01)

(56) References Cited

U.S. PATENT DOCUMENTS

| | | | | |
|---|---|---|---|---|
| 2005/0077572 | A1* | 4/2005 | Yamauchi | H01L 29/0619 257/341 |
| 2005/0116313 | A1* | 6/2005 | Lee | H01L 29/0634 257/500 |
| 2005/0242411 | A1* | 11/2005 | Tso | H01L 29/0634 257/480 |
| 2010/0200936 | A1* | 8/2010 | Saito | H01L 29/0634 257/409 |
| 2014/0077289 | A1* | 3/2014 | Miyajima | H01L 29/0634 257/329 |
| 2015/0206941 | A1* | 7/2015 | Uehigashi | H01L 29/872 257/77 |
| 2018/0012995 | A1* | 1/2018 | Hossain | H01L 29/7827 |
| 2019/0088737 | A1* | 3/2019 | Tamaki | H01L 29/36 |

* cited by examiner

SEMICONDUCTOR DEVICE AND METHOD OF MANUFACTURING THE SAME

CROSS-REFERENCE TO RELATED APPLICATION

The present application claims priority to Korean Patent Application No. 10-2018-0051816 filed on May 4, 2018, the entire contents of which is incorporated herein for all purposes by this reference.

BACKGROUND OF THE INVENTION

Field of the Invention

The present invention relates to a semiconductor device including a silicon carbide (SiC), and a manufacturing method thereof.

Description of Related Art

In accordance with trends towards large size and large capacity of an appliance in recent years, a necessity of a power semiconductor device having a high breakdown voltage, a high current, and a high speed switching characteristic comes to the front. A silicon carbide (SiC) power device that has been pointed out as the only device that can satisfy the above-described characteristic due to its superior characteristics with respect to a conventional silicon (Si) device is currently being actively researched and is in an early stage of market entry.

In a case of a SiC PiN diode, aspects that are suitable for a SiC diode element exist due to a high turn-on voltage and slow switching speed as a characteristic of a bipolar element.

Therefore, most SiC diodes currently mass-produced have a SiC Schottky Barrier Diode (SBD) structure, and to improve a leakage current characteristic of the SBD, a Junction Barrier Schottky (JBS) structure in which p+ type of region are formed as an ion injection type of in a bottom end of a Schottky junction portion has been provided.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a silicon carbide diode having high breakdown voltage and high current density.

A semiconductor device may include an n type of layer disposed on a first surface of a substrate; a p+ type of region disposed on the first surface of the substrate; a p− type of region disposed at a top portion of the n type of layer; a first electrode disposed on the p+ type of region and the p− type of region; and a second electrode disposed on a second surface of the substrate, wherein the side surface of the p+ type of region and the side surface of the n type of layer are in contact, and a thickness of the p+ type of region is a same as a total of a thickness of the n type of layer and a thickness of the p− type of region.

The ion doping concentration of the p+ type of region may be higher than the ion doping concentration of the p− type of region.

The side surface of the p+ type of region and the side surface of the p− type of region may be in contact.

A charge amount of the p+ type of region may be the same as a charge amount of the n type of layer.

The first electrode may include a first metal layer disposed on the p− type of region and a second metal layer disposed on the first metal layer, and the first metal layer may be in continuous contact with the p− type of region.

The first metal layer may include a Schottky metal, and the second metal layer and the second electrode may include an ohmic metal.

The second metal layer may be disposed on the p+ type of region.

The first metal layer may be disposed on the p+ type of region.

The p+ type of region may include a first P concentration layer disposed on the first surface of the substrate and a second P concentration layer disposed on the first P concentration layer.

An ion doping concentration of the first P concentration layer may be higher than an ion doping concentration of the second P concentration layer.

The n type of layer may include a first N concentration layer disposed on the first surface of the substrate and a second N concentration layer disposed on the first N concentration layer.

An ion doping concentration of the first N concentration layer may be higher than an ion doping concentration of the second N concentration layer.

The substrate may be an n+ type of silicon carbide substrate.

A manufacturing method of a semiconductor device may include forming an n type of layer on a first surface of a substrate; etching a portion of the n type of layer to form a substrate exposing region exposing a portion of the first surface of the substrate; forming a p+ type of region in the substrate exposing region; forming a p− type of region on the n type of layer; forming a first electrode on the p+ type of region and the p− type of region; and forming a second electrode on the second surface of the substrate, wherein the side surface of the p+ type of region and the side surface of the n type of layer are in contact, and a thickness of the p+ type of region is a same as a total of a thickness of the n type of layer and a thickness of the p− type of region.

According to an exemplary embodiment of the present invention, the semiconductor device may have a high breakdown voltage and high current density.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
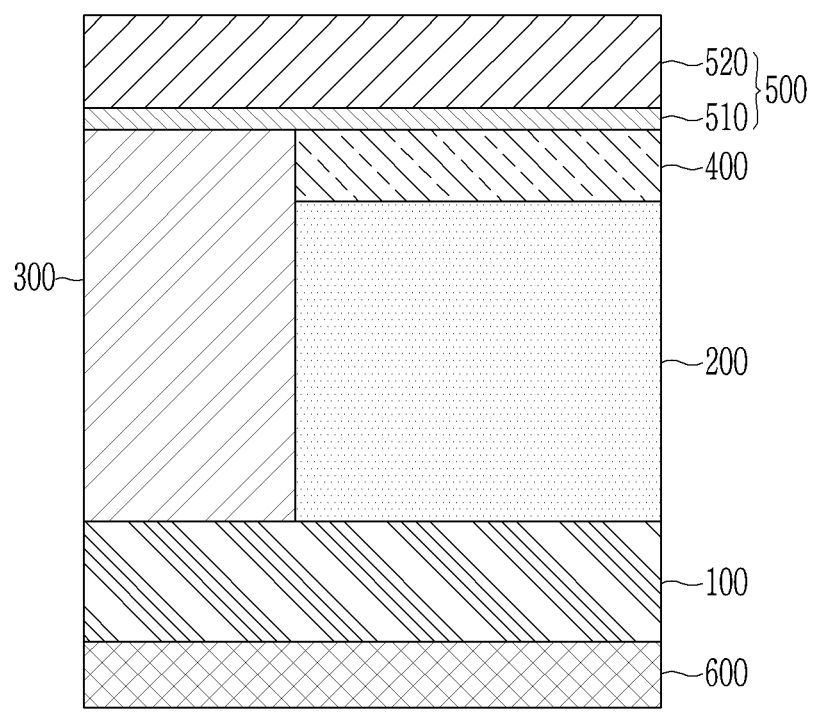
FIG. 1 is a schematic view showing an example of a cross-section of a semiconductor device according to an exemplary embodiment of the present invention.

It may be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the other hand, the invention(s) is/are intended to cover not only the exemplary embodiments, but also various alternatives, modifications, equivalents and other embodiments, which may be included within the spirit and scope of the invention as defined by the appended claims.

Hereinafter, various exemplary embodiments of the present invention will be described in detail with reference to the accompanying drawings. As those skilled in the art would realize, the described embodiments may be modified in various different ways, all without departing from the spirit or scope of the present invention. On the other hand, various exemplary embodiments introduced herein are provided to make included contents thorough and complete and to sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, it may be directly on the other layer or substrate, or a further layer or substrate intervening them may also be present.

FIG. 1 is a schematic view showing an example of a cross-section-of a semiconductor device according to an exemplary embodiment of the present invention.

Referring to FIG. 1, the semiconductor device according to the present exemplary embodiment includes a substrate 100, an n type of layer 200, a p+ type of region 300, a p− type of region 400, a first electrode 500, and a second electrode 600.

The semiconductor device according to the present exemplary embodiment of the present invention may be a diode. In the instant case, the first electrode 500 may be an anode, and the second electrode 600 may be a cathode.

The substrate 100 may be an n+ type of silicon carbide substrate.

The n type of layer 200 and the p+ type of region 300 are disposed on the first surface of the substrate 100, and the p− type of region 400 is disposed on top of the n type of layer 200. An ion doping concentration of the p+ type of region 300 is higher than an ion doping concentration of the p− type of region 400.

The side surface of the n type of layer 200 and the side surface of the p− type of region 400 are in contact with the side surface of the p+ type of region 300. A sum of a thickness of the n type of layer 200 and the thickness of the p− type of region 400 may be equal to the thickness of the p+ type of region 300. The p+ type of region 300 and the n type of layer 200 are in contact with each other, a PN junction is formed in the boundary surface therebetween. In the semiconductor device according to the exemplary embodiment of the present invention, an electric field has a maximum value in the PN junction, that is, a contact boundary surface of the p+ type of region 300 and the n type of layer 200.

The first electrode 500 is disposed on the p+ type of region 300 and the p− type of region 400 and includes a first metal layer 510 and a second metal layer 520. The first metal layer 510 may include a Schottky metal, and the second metal layer 520 may include an ohmic metal.

The first metal layer 510 is disposed on the p+ type of region 300 and the p− type of region 400, and the second metal layer 520 is disposed on the first metal layer 510. Here, the first metal layer 510 is in contact with the p− type of region 400, forming a Schottky junction in the boundary surface therebetween. The first metal layer 510 and the p− type of region 400 are in continuous contact. That is, the first metal layer 510 is not in contact with the n type of layer 200.

The second electrode 600 is disposed on the second surface of the substrate 100. Here, the second surface of the substrate 100 indicates an opposite surface to the first surface of the substrate 100. The second electrode 600 may include an ohmic metal.

In the semiconductor device according to the exemplary embodiment of the present invention, a depletion layer extends in a vertical direction and a horizontal direction for the first surface of the substrate 100 in the off state. In contrast, in a conventional Schottky barrier diode (SBD) element, the depletion layer extends in the vertical direction in the off state.

In the semiconductor device according to the exemplary embodiment of the present invention, the electric field has the maximum value in the contact boundary surface of the p+ type of region 300 and the n type of layer 200, that is, the PN junction, and the electric field is maintained in the vertical direction to the first surface of the substrate 100.

Next, this will be described with reference to FIG. 2A, FIG. 2B, and FIG. 2C.

Figure 2A:
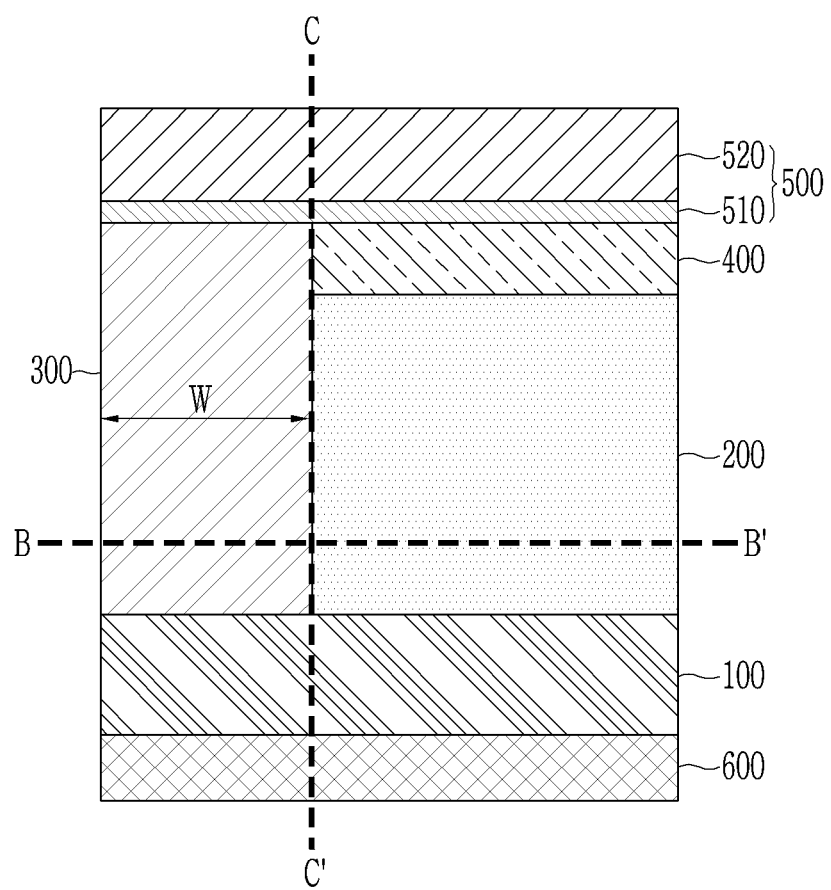
FIG. 2A, FIG. 2B, and FIG. 2C illustrate an electric field distribution of the semiconductor device of FIG. 1.
Figure 2B:
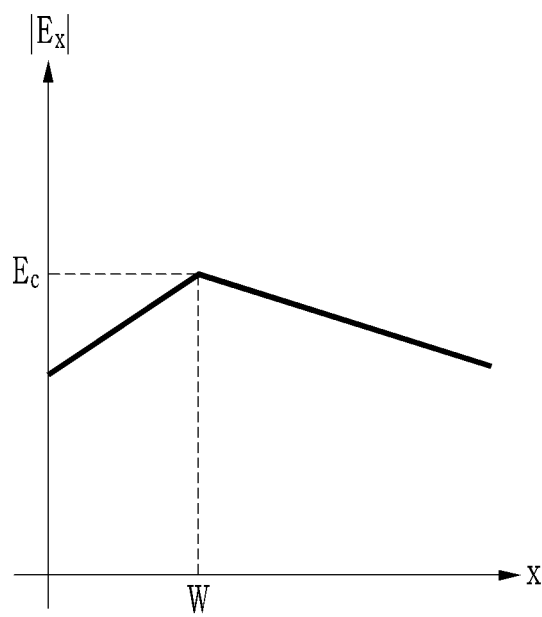
Figure 2C:
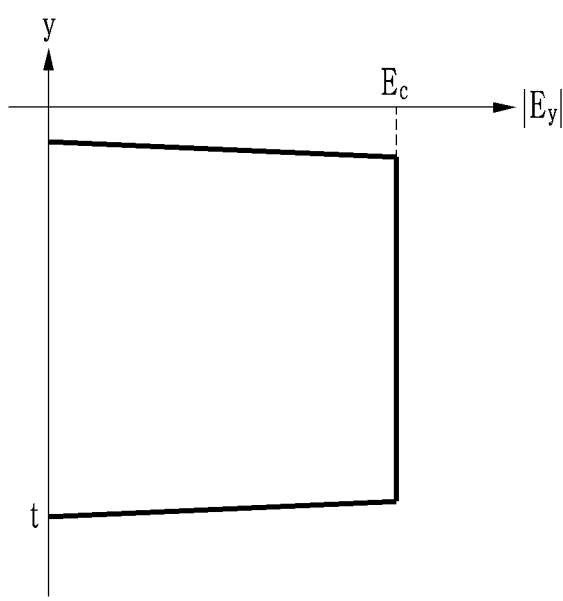

FIG. 2A shows a cutting line C-C' taken along the PN junction (the contact boundary surface of the p+ type of region 300 and the n type of layer 200) and a cutting line B-B' taken in the vertical direction to the PN junction are shown, FIG. 2B shows the electric field distribution according to the cutting line B-B' of FIG. 2A, and FIG. 2C shows the electric field distribution according to the cutting line C-C' of FIG. 2A.

FIG. 2B and FIG. 2C show the electric field distribution graph at the time of a breakdown generation. According to Poisson's equation, the value obtained by integrating the graph is proportional to the breakdown voltage.

Referring to FIG. 2B, it may be confirmed that the semiconductor device according to the present exemplary embodiment has a predetermined electric field value Ec in the PN junction and the electric field value is a maximum value. Also, referring to FIG. 2C, it may be confirmed that the semiconductor device according to the present exemplary embodiment maintains the predetermined electric field value Ec in the PN junction. In FIG. 2C, the area of the electric field distribution means a general breakdown voltage, and since the predetermined electric field value Ec is maintained in the PN junction, it may be confirmed that the breakdown voltage is increased as the area of the electric field distribution is increased.

Also, in the semiconductor device according to the exemplary embodiment of the present invention, the on resistance is decreased by the p+ type of region 300 having the ion doping concentration such that the current density is increased.

In the semiconductor device according to the exemplary embodiment of the present invention, when a charge amounts of the p+ type of region 300 and the n type of layer 200 forming the PN junction are equal, optimized performance may be obtained. This is defined to maintain a charge balance, and satisfies an equation below.

$$Np+ \times Wp+ = Nn \times Wn$$

Here, Np+ means the ion doping concentration of the p+ region, Wp+ means a width of the p+ region, Nn means the ion doping concentration of the n type of layer, and Wn means a width of the n type of layer.

Next, characteristics of the semiconductor device according to the exemplary embodiment and a conventional semiconductor device will be described with reference to Table 1.

Table 1 shows operation simulation results of the semiconductor device according to the present exemplary embodiment and the conventional semiconductor device.

A comparative example is a conventional Schottky barrier diode (SBD) element.

TABLE 1

| | Comparative example | Exemplary embodiment |
|---|---|---|
| Breakdown voltage (V) | 1858 | 3380 |
| Current density (A/cm$^2$) | 274 | 417 |
| Electrical conductive area cm$^2$ at 100 A | 0.365 | 0.240 |

Referring to Table 1, in the case of the semiconductor device according to the present exemplary embodiment compared with the diode element of the comparative example, it may be confirmed that the breakdown voltage is increased by 82%, and the current density is increased by 52%.

Also, in the case of the semiconductor device according to the present exemplary embodiment compared with the diode element of the comparative example, it may be confirmed that the electrical conductive area at 100 A is reduced by 34%. Accordingly, for the semiconductor device according to the exemplary embodiment of the present invention, a cost reduction of the semiconductor device is possible through an increased number of semiconductor devices per unit wafer and a yield improvement.

Next, a manufacturing method of the semiconductor device according to an exemplary embodiment of the present invention is described with reference to FIG. 3 to FIG. 6, and FIG. 1.

FIG. 3, FIG. 4, FIG. 5 and FIG. 6 are views schematically showing an example of a manufacturing method of a semiconductor device according to an exemplary embodiment of the present invention.

Figure 3:
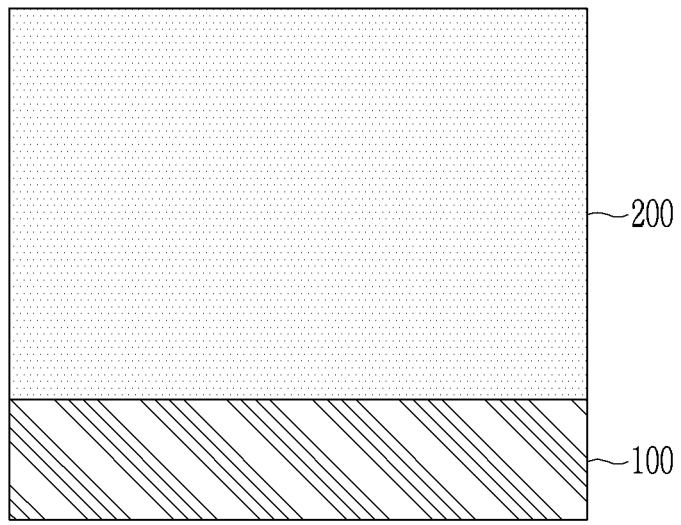
FIG. 3, FIG. 4, FIG. 5 and FIG. 6 are views schematically showing an example of a manufacturing method of a semiconductor device according to an exemplary embodiment of the present invention.

Referring to FIG. 3, a substrate 100 is prepared, and an n type of layer 200 is formed on the first surface of the substrate 100. Here, the substrate 100 may be an n+ type of silicon carbide substrate, and the n type of layer 200 may be formed by epitaxial growth.

Figure 4:
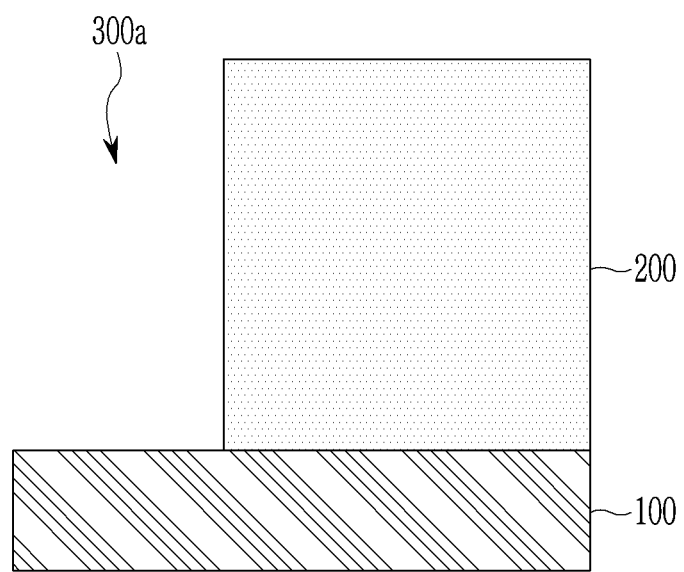

Referring to FIG. 4, a portion of the n type of layer 200 is etched to form a substrate exposing region 300a. The substrate exposing region 300a exposes portion of the first surface of the substrate 100.

Figure 5:
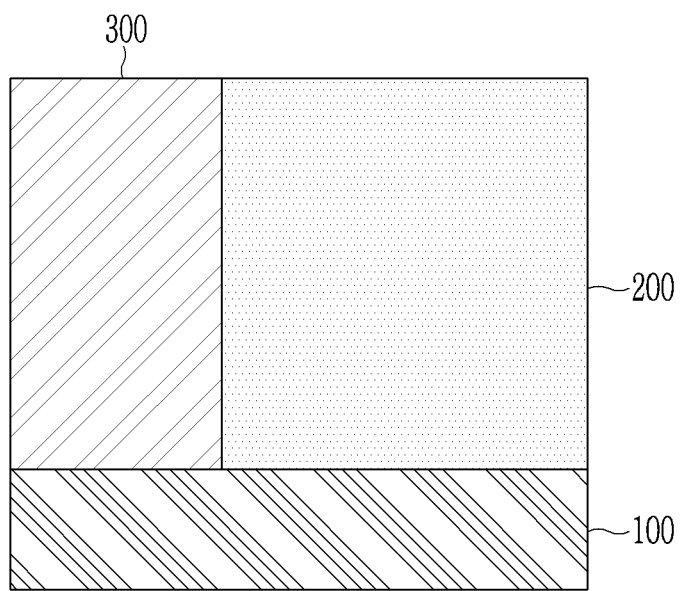

Referring to FIG. 5, the p+ type of region 300 is formed in the substrate exposing region 300a. That is, the p+ type of region 300 is formed on the first surface of the substrate 100 and on the side surface of the n type of layer 200. Here, the p+ type of region 300 may be formed by the epitaxial growth.

In the exemplary embodiment of the present invention, as shown in FIG. 4 and FIG. 5, after forming the n type of layer 200 on the substrate 100 by the epitaxial growth, the portion of the n type of layer 200 is etched to form the substrate exposing region 300a exposing the portion of the first surface of the substrate 100, and then the p+ type of region 300 is formed in the substrate exposing region 300a by the epitaxial growth. However, it is not limited thereto, and the n type of layer 200 and the p+ type of region 300 may be formed by multi-epitaxial growth and an ion injection process, or the n type of layer 200 and the p+ type of region 300 may be formed by a dual epitaxial process.

For example, the n type of layer 200 of a predetermined thickness is formed on the first surface of the substrate 100 by the epitaxial growth, and then the p+ type of region 300 of a predetermined thickness is formed by injecting a p type of ion such as boron (B), aluminum (Al), gallium (Ga), and indium (In) to the portion of the n type of layer 200. Next, the n type of layer 200 of a predetermined thickness is formed on the n type of layer 200 of the predetermined thickness and the p+ type of region 300 of the predetermined thickness by the epitaxial growth, and then the p+ type of region 300 of the predetermined thickness is formed by injecting the p type of ion to the portion of the n type of layer 200. The n type of layer 200 and the p+ type of region 300 may be completed by repeating the present process.

Also, after the n type of layer 200 may be formed to the portion of the first surface of the substrate 100 by the epitaxial growth, the p+ type of region 300 may be formed at the remaining portion of the first surface of the substrate 100 by the epitaxial growth.

Figure 6:
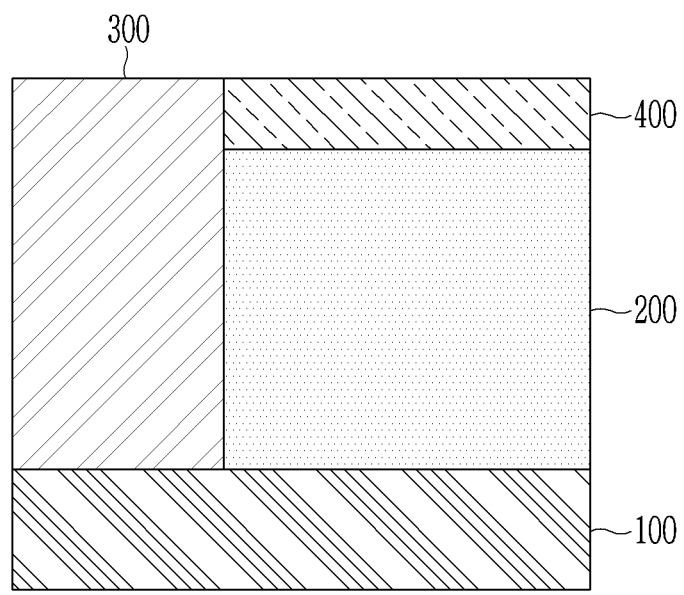

Referring to FIG. 6, the p− type of region 400 is formed at the top portion of the n type of layer 200. The p− type of region 400 is formed by injecting a p type of ion such as boron (B), aluminum (Al), gallium (Ga), and indium (In) to the portion of the n type of layer 200. However, it is not limited thereto, and the p− type of region 400 may be formed at the top portion of the n type of layer 200 by the epitaxial growth. The ion doping concentration of the p+ type of region 300 is higher than the ion doping concentration of the p− type of region 400. In the instant case, the sum of the thickness of the n type of layer 200 and the thickness of the p− type of region 400 may be the same as the thickness of the p+ type of region 300.

Referring to FIG. 1, a first metal layer 510 and a second metal layer 520 are sequentially formed on the p+ type of region 300 and the p− type of region 400, and a second electrode 600 is formed on the second surface of the n+ type of silicon carbide substrate 100. Here, the first metal layer 510 and the second metal layer 520 may form the first electrode 500. Also, the first metal layer 510 and the p− type of region 400 are in contact with each other, forming the Schottky junction in the boundary surface therebetween. The first metal layer 510 and the p− type of region 400 are in continuous contact. That is, the first metal layer 510 is not in contact with the n type of layer 200.

The first metal layer 510 may include the Schottky metal, and the second metal layer 520 and the second electrode 600 may include the ohmic metal.

The semiconductor device according to various exemplary embodiments of the present invention will now be described with reference to FIG. 7, FIG. 8, and FIG. 9.

Figure 7:
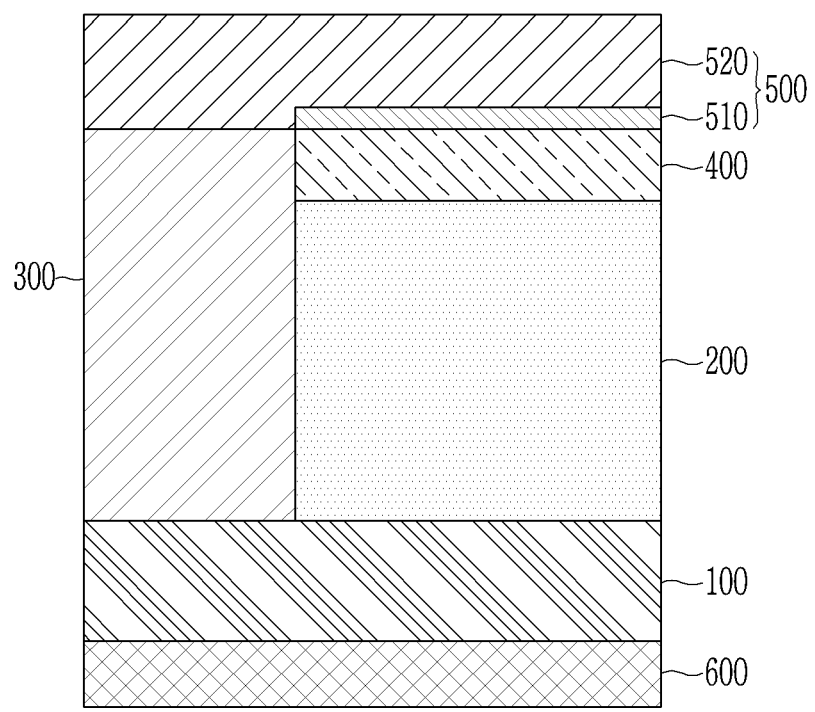
FIG. 7, FIG. 8, and FIG. 9 are views schematically showing an example of a cross-section of a semiconductor device according to various exemplary embodiments of the present invention, respectively.
Figure 8:
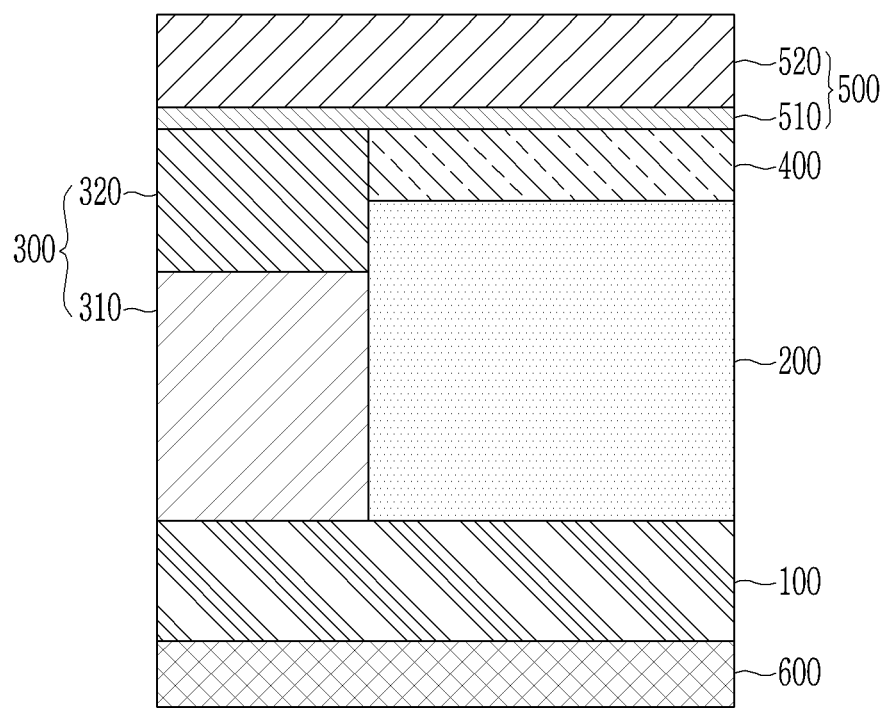
Figure 9:
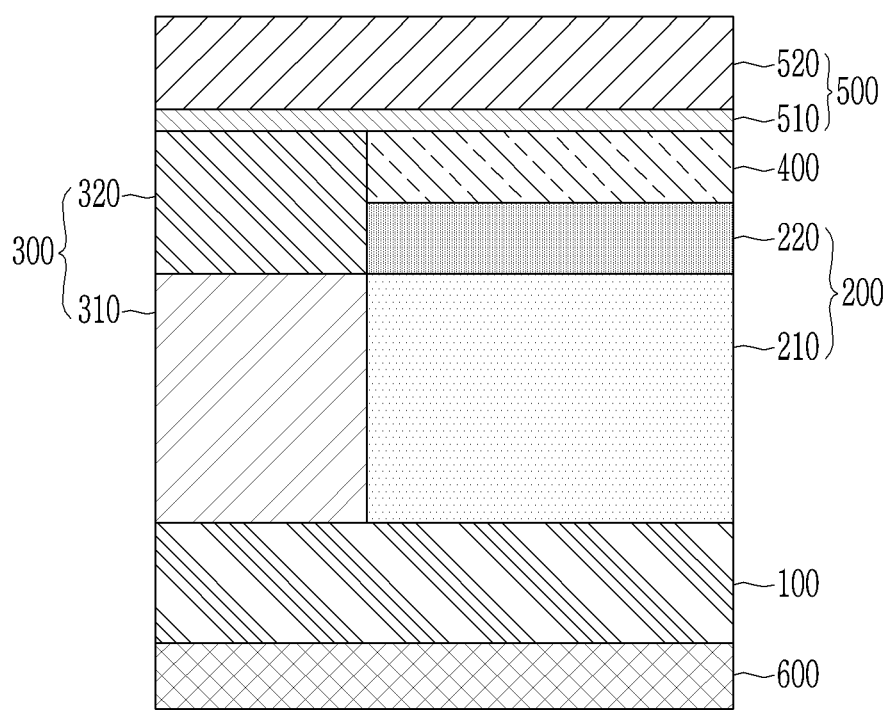

FIG. 7, FIG. 8, and FIG. 9 are views schematically showing an example of a cross-sectional of a semiconductor device according to various exemplary embodiments of the present invention, respectively.

Referring to FIG. 7, the semiconductor device according to the present exemplary embodiment of the present invention is the same as the semiconductor device of FIG. 1 except for the structure of the first electrode 500. Therefore, the description for the same structures is omitted.

The first electrode 500 is positioned on the p+ type of region 300 and the p− type of region 400, and includes the first metal layer 510 and the second metal layer 520. The first metal layer 510 may include the Schottky metal and the second metal layer 520 may include the ohmic metal.

The first metal layer 510 is disposed on the p− type of region 400, and the second metal layer 520 is disposed on the p+ type of region 300 and the first metal layer 510. Here, the first metal layer 510 and the p− type of region 400 are in contact with each other, forming the Schottky junction in the boundary surface therebetween. The first metal layer 510 and the p− type of region 400 are in continuous contact. That is, the first metal layer 510 is not in contact with the n type of layer 200. The second metal layer 520 and the p+ type of region 300 are in contact with each other, forming the ohmic junction in the boundary surface therebetween.

Referring to FIG. 8, the semiconductor device according to the present exemplary embodiment of the present invention is the same as the semiconductor device of FIG. 1 except for the structure of the p+ type of region 300. Therefore, the description of the same structures is omitted. In the semiconductor device according to the exemplary embodiment of the present invention, the p+ type of region 300 includes two concentration layers having different ion doping concentrations from each other.

The p+ type of region 300 includes a first P concentration layer 310 disposed on the first surface of the substrate 100 and the second P concentration layer 320 disposed on the first P concentration layer 310. Here, the ion doping concentration of the first P concentration layer 310 is higher than the ion doping concentration of the second P concentration layer 320. Also, the ion doping concentration of the second P concentration layer 320 is higher than the ion doping concentration of the p− type of region 400.

Referring to FIG. 9, the semiconductor device according to the present exemplary embodiment of the present invention is the same as the semiconductor device of FIG. 1 except for the structure of then type of layer 200 and the p+ type of region 300. Therefore, the description of the same structures is omitted. In the semiconductor device according to the exemplary embodiment of the present invention, the n type of layer 200 and the p+ type of region 300 respectively include two concentration layers having different ion doping concentrations from each other.

The n type of layer 200 includes a first N concentration layer 210 disposed on the first surface of the substrate 100 and a second N concentration layer 220 disposed on the first N concentration layer 210. Here, the ion doping concentration of the first N concentration layer 210 is higher than the ion doping concentration of the second N concentration layer 220.

The p+ type of region 300 includes the first P concentration layer 310 disposed on the first surface of the substrate 100 and the second P concentration layer 320 disposed on the first P concentration layer 310. Here, the ion doping concentration of the first P concentration layer 310 is higher than the ion doping concentration of the second P concentration layer 320. Also, the ion doping concentration of the second P concentration layer 320 is higher than the ion doping concentration of the p− type of region 400.

The p− type of region 400 is disposed on the n type of layer 200. That is, the p− type of region 400 is disposed on the second N concentration layer 220.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A semiconductor device comprising:
   an n type of layer disposed on a first surface of a substrate;
   a p+ type of region disposed on the first surface of the substrate;
   a p− type of region disposed at a top surface of the n type of layer;
   a first electrode disposed on a top surface of the p+ type of region and a top surface of the p− type of region; and
   a second electrode disposed on a second surface of the substrate,
   wherein a side surface of the p+ type of region and a side surface of the n type of layer are in contact,
   wherein a thickness of the p+ type of region is a same as a total of a thickness of the n type of layer and a thickness of the p− type of region,
   wherein an ion doping concentration of the p+ type of region is higher than an ion doping concentration of the p− type of region,
   wherein the first electrode includes a first metal layer disposed on the top surface of the p− type of region and a second metal layer disposed on the first metal layer,
   wherein the first metal layer is in continuous contact with the p− type of region and the second metal layer is disposed on the top surface of the p+ type of region, and
   wherein the first metal layer includes a Schottky metal and the second metal layer includes an ohmic metal.

2. The semiconductor device of claim 1, wherein the side surface of the p+ type of region and a side surface of the p− type of region are in contact.

3. The semiconductor device of claim 2, wherein a charge amount of the p+ type of region is a same as a charge amount of the n type of layer.

4. The semiconductor device of claim 3,
wherein the second metal layer includes the ohmic metal.

5. The semiconductor device of claim 1, wherein the substrate is an n+ type of silicon carbide substrate.

6. A semiconductor device comprising,
an n type of layer disposed on a first surface of a substrate;
a p+ type of region disposed on the first surface of the substrate;
a p− type of region disposed at a top surface of the n type of layer;
a first electrode disposed on a top surface of the p+ type of region and a top surface of the p− type of region; and
a second electrode disposed on a second surface of the substrate,
wherein a side surface of the p+ type of region and a side surface of the n type of layer are in contact, and
wherein a thickness of the p+ type of region is a same as a total of a thickness of the n type of layer and a thickness of the p− type of region,
wherein an ion doping concentration of the p+ type of region is higher than an ion doping concentration of the p− type of region,
wherein the first electrode includes a first metal layer disposed on the top surface of the p− type of region and a second metal layer disposed on the first metal layer,
wherein the first metal layer is in continuous contact with the p− type of region,
wherein the p+ type of region includes a first P concentration layer disposed on the first surface of the substrate and a second P concentration layer disposed on the first P concentration layer,
wherein the first metal layer of the first electrode is disposed on the top surface of the p− type of region and a top surface of the second P concentration layer, and
wherein an ion doping concentration of the first P concentration layer is higher than an ion doping concentration of the second P concentration layer,
wherein the n type of layer includes a first N concentration layer disposed on the first surface of the substrate and a second N concentration layer disposed on the first N concentration layer,
wherein the p− type of region is disposed on a top surface of the second N concentration layer, and
wherein an ion doping concentration of the first N concentration layer is higher than an ion doping concentration of the second N concentration layer.

7. The semiconductor device of claim 6, wherein the side surface of the p+ type of region and a side surface of the p− type of region are in contact.

8. The semiconductor device of claim 7, wherein a charge amount of the p+ type of region is a same as a charge amount of the n type of layer.

9. The semiconductor device of claim 8,
wherein the first metal layer includes a Schottky metal, and
wherein the second metal layer and the second electrode include an ohmic metal.

10. The semiconductor device of claim 9, wherein the first metal layer is disposed on the top surface of the p+ type of region and the top surface of the p− type of region.

11. The semiconductor device of claim 6, wherein the substrate is an n+ type of silicon carbide substrate.

* * * * *